United States Patent
Xu et al.

(10) Patent No.: US 11,481,052 B2
(45) Date of Patent: Oct. 25, 2022

(54) DISPLAY PANEL, PRODUCTION METHOD AND DISPLAY DEVICE THEREOF

(71) Applicants: Kunshan New Flat Panel Display Technology Center Co., Ltd., Jiangsu (CN); KunShan Go-Visionox Opto-Electronics Co., Ltd., Jiangsu (CN)

(72) Inventors: Tong Xu, Kunshan (CN); Rui Liu, Kunshan (CN); Weiguo Li, Kunshan (CN); Qi Wang, Kunshan (CN); Qiang Lu, Kunshan (CN)

(73) Assignees: Kunshan New Flat Panel Display Technology Center Co., Ltd., Kunshan (CN); KunShan Go-Visionox Opto-Electronics Co., Ltd., Kunshan (CN)

(*) Notice: Subject to any disclaimer, the term of this patent is extended or adjusted under 35 U.S.C. 154(b) by 0 days.

(21) Appl. No.: 17/211,006

(22) Filed: Mar. 24, 2021

(65) Prior Publication Data

US 2021/0223879 A1  Jul. 22, 2021

Related U.S. Application Data

(63) Continuation of application No. PCT/CN2019/100538, filed on Aug. 14, 2019.

(30) Foreign Application Priority Data

Feb. 23, 2019 (CN) .......................... 201910134531.2

(51) Int. Cl.
G06F 3/041 (2006.01)
H01L 27/32 (2006.01)
H01L 51/52 (2006.01)

(52) U.S. Cl.
CPC .... *G06F 3/041* (2013.01); *G06F 2203/04102* (2013.01); *H01L 27/3244* (2013.01); *H01L 51/5246* (2013.01); *H01L 51/5253* (2013.01)

(58) Field of Classification Search
CPC .......... G06F 2203/04102; G06F 3/041; H01L 27/3244; H01L 51/5246; H01L 51/5253
See application file for complete search history.

(56) References Cited

U.S. PATENT DOCUMENTS

2007/0159095 A1* 7/2007 Matsuda ............. H01L 51/5253
                                                        313/512
2013/0154969 A1* 6/2013 Guenin .................. B29C 45/00
                                                        345/173

(Continued)

FOREIGN PATENT DOCUMENTS

CN  101303463 A  11/2008
CN  101679660 A  3/2010

(Continued)

OTHER PUBLICATIONS

International Search Report dated Nov. 18, 2019 in corresponding International Application No. PCT/CN2019/100538; 8 pages.

(Continued)

*Primary Examiner* — Temesghen Ghebretinsae
*Assistant Examiner* — Sosina Abebe
(74) *Attorney, Agent, or Firm* — Maier & Maier, PLLC

(57) ABSTRACT

A display panel, a production method and a display device thereof. The display panel includes: a flexible circuit board, a touch layer, a cover plate, and an auxiliary transparent layer disposed close to the cover plate; the flexible circuit board is connected to the touch layer, a first sealant is provided at a boundary position between the touch layer and the flexible circuit board and is located on a side of the flexible circuit board facing the cover; a distance between a surface of the auxiliary transparent layer facing the cover (Continued)

plate and the cover plate is not greater than a distance between a surface of the first sealant facing the cover plate and the cover plate.

16 Claims, 1 Drawing Sheet

(56) References Cited

U.S. PATENT DOCUMENTS

| | | | | |
|---|---|---|---|---|
| 2015/0185527 | A1* | 7/2015 | Chang | H01L 51/5246 349/12 |
| 2016/0152875 | A1* | 6/2016 | No | C09J 133/08 359/893 |
| 2017/0069692 | A1 | 3/2017 | Lee et al. | |
| 2018/0182984 | A1* | 6/2018 | Lim | H01L 51/5246 |
| 2019/0088906 | A1* | 3/2019 | Park | H01L 51/5234 |
| 2019/0182969 | A1* | 6/2019 | Chen | G02F 1/1333 |

FOREIGN PATENT DOCUMENTS

| | | |
|---|---|---|
| CN | 102171630 A | 8/2011 |
| CN | 202872874 U | 4/2013 |
| CN | 203350830 U | 12/2013 |
| CN | 104182069 A | 12/2014 |
| CN | 204576461 U | 8/2015 |
| CN | 105185922 A | 12/2015 |
| CN | 106054428 A | 10/2016 |
| CN | 106125359 A | 11/2016 |
| CN | 206465578 U | 9/2017 |
| CN | 107359185 A | 11/2017 |
| CN | 107424519 A | 12/2017 |
| CN | 206863396 U | 1/2018 |
| CN | 206892842 U | 1/2018 |
| CN | 107863002 A | 3/2018 |
| CN | 108563363 A | 9/2018 |
| CN | 207818084 U | 9/2018 |
| CN | 108807717 A | 11/2018 |
| CN | 108829286 A | 11/2018 |
| CN | 108962033 A | 12/2018 |
| CN | 109144312 A | 1/2019 |
| CN | 109920331 A | 6/2019 |
| JP | 2008216466 A | 9/2008 |
| JP | 2017-163067 A | 9/2017 |
| KR | 20130101944 A | 9/2013 |
| KR | 1020140033546 A | 3/2014 |
| KR | 1020150076869 A1 | 7/2015 |
| KR | 20160014873 A | 2/2016 |
| KR | 20170026020 A | 3/2017 |
| TW | 201445396 A | 12/2014 |
| WO | 2017154959 A1 | 9/2017 |
| WO | 2018/081489 A1 | 5/2018 |

OTHER PUBLICATIONS

Office Action dated Jun. 29, 2020 in corresponding Taiwanese Application No. 108131823; 7 pages.
Office Action dated Nov. 21, 2019 in corresponding Chinese Application No. 201910134531.2; 6 pages.
Office Action dated Jan. 17, 2020 in corresponding Chinese Application No. 201910134531.2; 6 pages.
Office Action dated Apr. 25, 2022, in connection with corresponding Korean Application No. 10-2021-7013314 (13 pp., including machine-generated English translation).
Extended European Search Report dated Dec. 10, 2021, in connection with corresponding EP application No. 19916414.6; 12 pages.
Japanese Office Action dated Aug. 2, 2022, in corresponding to Japanese Patent Application No. 2021-523598; 9 pages (with English Translation).

* cited by examiner

DISPLAY PANEL, PRODUCTION METHOD AND DISPLAY DEVICE THEREOF

CROSS-REFERENCE TO RELATED APPLICATIONS

This application is a continuation of International Application No. PCT/CN2019/100538, filed on Aug. 14, 2019, which claims priority to Chinese Patent Application No. 201910134531.2, filed on Feb. 23, 2019. Both of the aforementioned applications are hereby incorporated by reference in their entireties.

TECHNICAL FIELD

The present disclosure relates to the technical field of display devices and, particularly, to a display panel and a display device.

BACKGROUND

With the gradual development of display device technology, flexible display panels have been gradually applied to wearable devices, such as smart watches, wrist phones, etc.

The display panel includes a flexible circuit board, and a cover plate, a polarizer, a touch layer and a display layer that are stacked in sequence; one end of the flexible circuit board is connected with a control device, and the other end of the flexible circuit board is connected with the touch layer to realize the touch control of the display device. During production, the display layer, the touch layer and the polarizer are formed at first, and then the flexible circuit board is connected to the touch layer; in order to prevent the outside air from contacting with the touch layer, a solid sealant is usually attached to a boundary position between the touch layer and the flexible circuit board, then the cover plate is attached to the polarizer.

However, a volume of the solid sealant is relatively large, and after the solid sealant is attached, a top surface of the solid sealant away from the touch layer is closer to the cover plate than a top surface of the polarizer away from the touch layer; when the cover plate is installed, the solid sealant first contacts with the cover plate, and cracks are likely to occur between the solid sealant and the touch layer after the solid sealant being stressed, resulting in the sealing failure of the touch layer.

SUMMARY

In view of the above, the present disclosure provides a display panel and a display device to solve the technical problem that when a cover plate is installed, a solid sealant first contacts with the cover plate, and cracks are likely to occur between the solid sealant and a touch layer after the solid sealant being stressed, resulting in the sealing failure of the touch layer.

A embodiment of the present disclosure provides a display panel, including: a flexible circuit board, a touch layer, a cover plate, and an auxiliary transparent layer disposed between the cover plate and the touch layer and close to the cover plate; the flexible circuit board is connected to the touch layer, a first sealant is provided at a boundary position between the touch layer and the flexible circuit board, and the first sealant is located on sides of the flexible circuit board and the touch layer that face the cover plate; a distance between a surface of the auxiliary transparent layer facing the cover plate and the cover plate is not greater than a distance between a surface of the first sealant facing the cover plate and the cover plate.

Preferably, the boundary position includes a boundary line between the touch layer and an input end of the flexible circuit board, a surface of the touch layer, covered by the first sealant and close to the cover plate, at one side of the boundary line, and a surface of the flexible circuit board, covered by the first sealant and close to the cover plate, at the other side of the boundary line.

Preferably, the display panel further includes a second sealant, the second sealant is disposed on a side of the flexible circuit board away from the cover plate, located at a boundary position between the touch layer and the flexible circuit board, and seals a boundary line between a surface of the flexible circuit board away from the cover plate and the touch layer. Preferably, the first sealant and the second sealant are selected from any one or more of polyacrylate, epoxy acrylate, and linear unsaturated polyester.

Preferably, the display panel further includes a polarizer, and the polarizer is disposed between the touch layer and the auxiliary transparent layer or on a side of the touch layer away from the cover plate.

Preferably, the auxiliary transparent layer includes an optical adhesive layer.

Preferably, the first sealant and the second sealant have an elastic modulus greater than an elastic modulus of the optical adhesive layer.

Preferably, an installation step is provided on the surface of the touch layer close to the input end of the flexible circuit board.

Preferably, the cover plate includes a hard layer and an organic layer that are stacked, and the hard layer is disposed away from the touch layer. Preferably, the hard layer is an ultra-thin glass layer, and the organic layer is a polyimide layer or a thermoplastic polyurethane elastomer layer.

Preferably, the display panel further includes a sealing layer, and a substrate and a display layer that are stacked in sequence along a direction of light emitting; the sealing layer is located between the cover plate and the substrate and is disposed around an outer edge of the display layer. Preferably, the sealing layer is formed on the substrate and extends upward from the substrate to contact with the cover plate.

Preferably, the sealing layer includes a plurality of sealing sublayers stacked along the direction of light emitting, and adjacent sealing sublayers are slidable relatively.

Preferably, an edge of the auxiliary transparent layer extends toward the substrate to form a sealed side, and the sealed side wraps film layers between the substrate and the auxiliary transparent layer.

Preferably, a gap is provided between the sealing layer and the auxiliary transparent layer, and the gap is filled with a flow blocking medium.

Preferably, the display layer includes an array substrate formed on the substrate, and a pixel defining layer formed on the array substrate, and is encapsulated by an encapsulation layer; the encapsulation layer is connected to the touch layer (for example, through a connecting glue).

Preferably, the flow blocking medium includes insulating oil, and the sealing layer includes a closed-cell foam layer.

An embodiment of the present disclosure also provides a display device including the display panel as described above.

In the display panel and the display device provided by the present disclosure, the occurrence of cracks between the first sealant and the touch layer as well as the flexible circuit board, caused by the stress of the first sealant, can be avoided by disposing the auxiliary transparent layer between the touch layer and the cover plate, disposing the auxiliary transparent layer close to the cover plate, making the distance between the surface of the auxiliary transparent layer facing the cover plate and the cover plate not greater than the distance between the surface of the first sealant facing the cover plate and the cover plate; and making the cover plate first contacts with the auxiliary transparent layer when the cover plate is installed.

An embodiment of the present disclosure also provides a method for producing a display panel, including:

forming a touch layer, attaching a flexible circuit board to the touch layer, forming a first sealant at a boundary position between the touch layer and the flexible circuit board, forming an auxiliary transparent layer on the touch layer, and covering a cover plate on the auxiliary transparent layer.

Where, the first sealant seals a boundary line between the touch layer and the flexible circuit board, and covers the touch layer at the boundary position, and a distance between a surface of the auxiliary transparent layer facing the cover plate and the cover plate is not greater than a distance between a surface of the first sealant facing the cover plate and the cover plate.

Preferably, the method further includes disposing a polarizer on the touch layer or on the side of the touch layer away from the cover plate.

According to the display panel and the display device of the present disclosure prepared according to the above method, the occurrence of cracks between the first sealant and the touch layer as well as the flexible circuit board, caused by the stress of the first sealant, can be avoided by disposing the auxiliary transparent layer between the touch layer and the cover plate, disposing the auxiliary transparent layer close to the cover plate, making the distance between the surface of the auxiliary transparent layer facing the cover plate and the cover plate not greater than the distance between the surface of the first sealant facing the cover plate and the cover plate; and making the cover plate first contacts with the auxiliary transparent layer when the cover plate is installed.

BRIEF DESCRIPTION OF THE DRAWINGS

In order to describe the technical solutions in embodiments of the present disclosure more clearly, the following briefly introduces the accompanying drawings needed for describing the embodiments. Apparently, the accompanying drawings in the following description are some embodiments of the present disclosure, and persons of ordinary skill in the art may still derive other drawings from these accompanying drawings without creative effort.

DETAILED DESCRIPTION OF THE EMBODIMENTS

To make the objectives, technical solutions, and advantages of embodiments of the present invention clearer, the following clearly and comprehensively describes the technical solutions in embodiments of the present invention with reference to the accompanying drawings in embodiments of the present invention. Apparently, the described embodiments are merely a part rather than all embodiments of the present invention. All other embodiments obtained by persons of ordinary skill in the art based on embodiments of the present invention without creative effort shall fall within the protection scope of the present invention.

Figure 1:
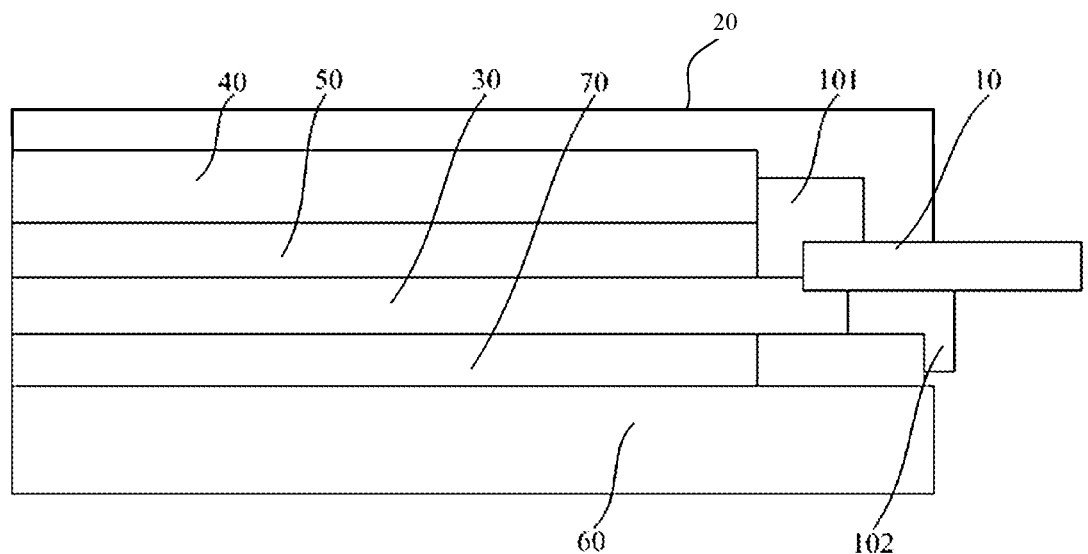
FIG. 1 is a schematic diagram of the connection between a flexible circuit board and a touch layer in a display panel according to an embodiment of the disclosure.

FIG. 1 is a schematic diagram of the connection between a flexible circuit board and a touch layer in a display panel according to an embodiment of the disclosure.

Referring to FIG. 1, an embodiment provides a display panel, including: a flexible circuit board 10, a touch layer 30, a cover plate 20, and an auxiliary transparent layer 40 disposed close to the cover plate 20; the flexible circuit board 10 is connected to the touch layer 30, a first sealant 101 is provided at a boundary position between the touch layer 30 and the flexible circuit board 10, and the first sealant 101 is located on a side of the flexible circuit board 10 facing the cover 20; a distance between a surface of the auxiliary transparent layer 40 facing the cover plate 20 and the cover plate 20 is not greater than a distance between a surface of the first sealant 101 facing the cover plate 20 and the cover plate 20.

In the embodiment, a plurality of touch units are provided in the touch layer 30, a circuit on the flexible circuit board 10 is electrically connected with the touch units, and the flexible circuit board 10 is connected with an external motherboard to realize touch control. With reference to the orientation shown in FIG. 1, an installation step is provided on an upper surface of the touch layer 30 close to a right end of the touch layer 30, and an input end of the flexible circuit board 10 is attached to the installation step. Correspondingly, a boundary position between the touch layer 30 and the flexible circuit board 10 is a boundary line between the touch layer 30 and the input end of the flexible circuit board, a surface of the touch layer 30, covered by the first sealant 101 and close to the cover 20, at a left side of the boundary line, and a surface of the flexible circuit board 10, covered by the first sealant 101 and close to the cover 20, at a right side of the boundary line. In addition, the boundary position between the flexible circuit board 10 and the touch layer 30 further includes a boundary line between a lower surface of the flexible circuit board 10 and the right end of the touch layer 30, and an area near the boundary line; the first sealant 101 is disposed on the surfaces of the flexible circuit board 10 and the touch layer 30 that face the cover 20, that is, the first sealant 101 covers the boundary line between a top surface of the touch layer 30 and a top surface of the input end of the flexible circuit board 10, a portion of the top surface of the touch layer 30 on the left side of the boundary line, and a portion of the top surface of the flexible circuit board 10 on the right side of the boundary line, so as to achieve the sealing of the boundary line between the flexible circuit board 10 and the touch layer 30. Besides, the first sealant 101 also improves the connection force between the flexible circuit board 10 and the touch layer 30, so as to prevent the touch layer 30 from being separated from the flexible circuit board 10 when the display panel is bent.

Furthermore, the first sealant 101 also covers a portion of the touch layer 30 located outside the auxiliary transparent layer 40, which can prevent the outside air from contacting with the touch layer 30.

In the embodiment, the cover plate 20 is located at the outermost side of the display panel along a direction of light emitting, so as to achieve the protection of each film layer; taking the orientation shown in FIG. 1 as an example, the cover 20 is located at the uppermost end of the display panel.

In the embodiment, preferably, the cover plate 20 includes a hard layer and an organic layer that are stacked, and the hard layer is disposed away from the touch layer 30. A composite cover plate composed of the hard layer and the organic layer improves the surface hardness and pencil hardness of the cover plate 20 while ensuring light transmittance.

Specifically, the hard layer in the embodiment is an ultra-thin glass layer, and the organic layer is a polyimide layer or a thermoplastic polyurethane elastomer layer. Ultra-thin glass is a glass plate with a thickness of less than 0.1 mm, which has good flexibility to avoid breaking when the display panel is bent.

In the embodiment, the auxiliary transparent layer 40 is disposed between the cover plate 20 and the touch layer 30, and the auxiliary transparent layer 40 is disposed close to the cover plate 20; the distance between the surface of the auxiliary transparent layer 40 facing the cover plate 20 and the cover plate 20 is not greater than the distance between the surface of the first sealant 101 facing the cover plate 20 and the cover plate 20. Referring to the orientation shown in FIG. 1, a top surface of the first sealant 101 is aligned with a top surface of the auxiliary transparent layer 40, or the top surface of the auxiliary transparent layer 40 is closer to the cover plate 20 than the top surface of the first sealant 101, so as to avoid that the first sealant 101 first contacts with the cover plate 20 when the cover plate 20 is installed, which causes the cracks between the first sealant 101 and the touch layer 30 or the flexible circuit board 10 after the first sealant 101 being stressed, thereby avoiding seal failure.

Preferably, the auxiliary transparent layer 40 includes an optical adhesive layer. The auxiliary transparent layer 40 made of the optical adhesive can bond the cover plate 20 and the touch layer 30 together to improve the connection force between the cover plate 20 and the touch layer 30. Where the optical adhesive layer may include adhesives such as organic silica gel, polyurethane or epoxy resin.

A production process of the display panel provided in the embodiment is: forming the touch layer 30 having an installation step, then attaching the flexible circuit board 10 onto the installation step of the touch layer 30, forming the first sealant 101 at the boundary position between the touch layer 30 and the flexible circuit board 10 to seal the boundary line between the touch layer 30 and the flexible circuit board 10 and to be capable of covering the touch layer 30 at the boundary position at the same time, to prevent the outside air from contacting with the touch layer 30 at the boundary position; then forming the auxiliary transparent layer 40 on the touch layer 30, making the distance between the surface of the auxiliary transparent layer 40 facing the cover plate 20 and the cover plate 20 not greater than the distance between the surface of the first sealant 101 facing the cover plate 20 and the cover plate 20; and then covering the cover plate 20 on the auxiliary transparent layer 40 to complete the manufacture of the display panel.

In the display panel provided by the embodiment, the occurrence of cracks between the first sealant 101 and the touch layer 30 as well as the flexible circuit board 10, caused by the stress of the first sealant 101, can be avoided by disposing the auxiliary transparent layer 40 between the touch layer 30 and the cover plate 20, disposing the auxiliary transparent layer 40 close to the cover plate 20, making the distance between the surface of the auxiliary transparent layer 40 facing the cover plate 20 and the cover plate 20 not greater than the distance between the surface of the first sealant 101 facing the cover plate 20 and the cover plate 20; and making the cover plate 20 first contacts with the auxiliary transparent layer 40 when the cover 20 is installed.

The display panel provided in the embodiment further includes a second sealant 102, which is disposed on a side of the flexible circuit board 10 away from the cover 20 and located at a boundary position between the touch layer 30 and the flexible circuit board 10. The second sealant 102 can seal a boundary line between a surface of the flexible circuit board 10 away from the cover 20 and the touch layer 30 to further improve the sealing performance between the flexible circuit board 10 and the touch layer 30, and at the same time, the second sealant 102 can also partially cover the touch layer 30 to further prevent the outside air from contacting with the touch layer 30. In addition, the second sealant 102 can abut against the flexible circuit board 10 to prevent the flexible circuit board 10 from wobbling when the flexible circuit board 10 is bent, thereby avoiding the occurrence of cracks between the first sealant 101 and the touch layer 30 or the flexible circuit board 10 when the flexible circuit board 10 is bent.

In the embodiment, the first sealant 101 and the second sealant 102 can be of a same material or different materials, as long as the first sealant 101 and the second sealant 102 have good water-vapor resistance. Preferably, the first sealant 101 and the second sealant 102 have an elastic modulus greater than an elastic modulus of the optical adhesive layer, so that when the flexible circuit board 10 is bent, the deformation of the first sealant 101 and the second sealant 102 is small, which reduces the wobble of the input end of the flexible circuit board 10 to avoid the occurrence of cracks between the first sealant 101 and the touch layer 30 or the flexible circuit board 10. Preferably, the first sealant 101 and the second sealant 102 may be selected from any one or more of polyacrylate, epoxy acrylate, and linear unsaturated polyester. Preferably, after forming the first sealant 101 and the second sealant 102, the first sealant 101 and the second sealant 102 can be cured by the way of heating curing or UV curing and the like to increase the elastic modulus of the first sealant 101 and the second sealant 102.

Exemplarily, the first sealant 101 and the second sealant 102 cured by UV curing need to meet the following conditions: the viscosity of the first sealant 101 is less than or equal to 2000 cps, the viscosity of the second sealant 102 is between 1000-6000 cps; the curing wavelengths of both them are 365 nm; the curing energy is less than or equal to 2000 mj/cm$^2$; the curing depths of both them are less than or equal to 1 mm; the adhesive temperatures of both them are less than or equal to 50° C.; the shore hardness of the second sealant 102 is less than or equal to D50; and the shrinkage rates of both them are less than 2.5%.

A display panel provided by another embodiment further includes a polarizer 50, and the polarizer 50 is disposed between the touch layer 30 and the auxiliary transparent layer 40. The polarizer 50 can make a treatment on rays of light to improve the display effect of the display panel.

An optical adhesive is disposed between the polarizer 50 and the touch layer 30 to realize the connection between the polarizer 50 and the touch layer 30.

A production process of the display panel provided in the embodiment is: forming the touch layer 30 having the installation step, then attaching the flexible circuit board 10 onto the installation step of the touch layer 30, forming the first sealant 101 at the boundary position between the touch layer 30 and the flexible circuit board 10 to seal the boundary line between the touch layer 30 and the flexible circuit board 10, where the first sealant 101 can cover the touch layer 30 at the boundary position to prevent the outside air from contacting with the touch layer 30 at the boundary position at the same time; then covering the polarizer 50 on the touch layer 30, where the polarizer 50 can connect with the touch layer 30 through the optical adhesive; forming the auxiliary transparent layer 40 on a surface of the polarizer 50 away from the touch layer 30, where a distance between a surface of the auxiliary transparent layer 40 facing a cover plate 20 and the cover plate 20 is not greater than a distance between a surface of the first sealant 101 facing the cover plate 20 and the cover plate 20; and then covering the cover plate 20 on the auxiliary transparent layer 40 to complete the manufacture of the display panel.

Preferably, in the above production process, the auxiliary transparent layer 40 may be attached in advance to the surface of the polarizer 50 facing the cover plate 20 to form a transparent component; after the first sealant 101 is formed, the transparent component is attached onto the touch layer 30, and then the cover plate 20 is covered on the auxiliary transparent component, which can shorten the manufacturing time of the display panel and facilitate processing.

In an embodiment, the polarizer 50 may also be disposed on a side of the touch layer 30 away from the cover plate 20, at this time, the polarizer 50 may also be connected to the touch layer 30 by the optical adhesive, and the touch layer 30 is connected with the cover plate 20 through the auxiliary transparent layer 40.

Figure 2:
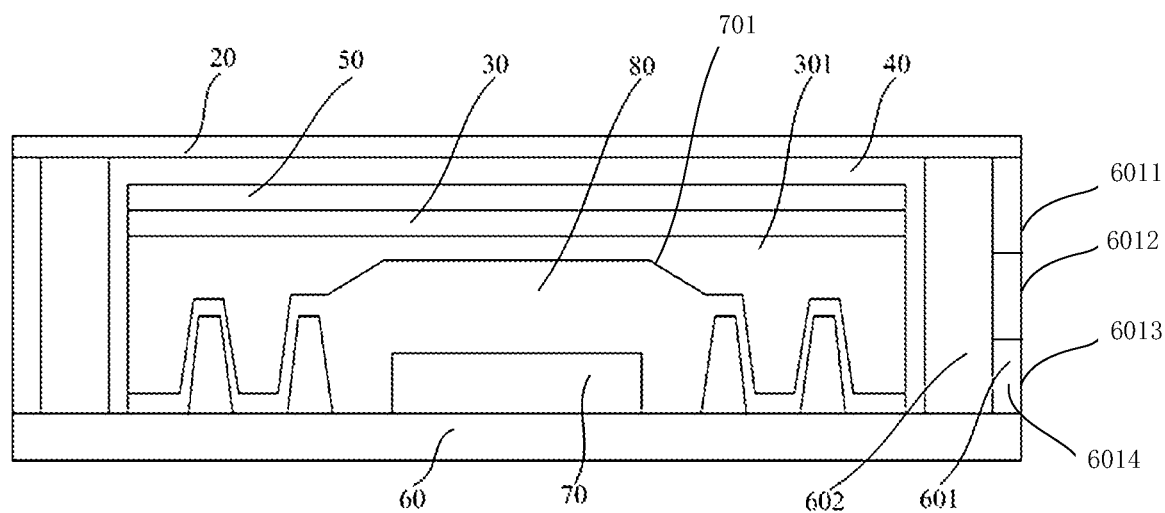
FIG. 2 is a schematic diagram of a position of a sealing layer and a flow blocking medium in a display panel according to an embodiment of the present disclosure.

FIG. 2 is a schematic diagram of a position of a sealing layer and a flow blocking medium in a display panel according to an embodiment of the present disclosure.

Referring to FIG. 2, the display panel provided in the embodiment further includes a sealing layer 601, and a substrate 60 and a display layer 70 that are stacked in sequence along the direction of light emitting, where the sealing layer 601 is located between the cover plate 20 and the substrate 60, and is disposed around an outer edge of the display layer 70. That the sealing layer 601 is disposed around the outer edge of the display layer 70 can prevent the outside air from contacting with each film layer in the display layer 70, thereby improving the sealing performance of the display panel.

Preferably, the sealing layer 601 is formed on the substrate 60 and extends upward from the substrate 60 to contact with the cover plate 20. At this time, the sealing layer 601 surrounds all the film layers between the cover plate 20 and the substrate 60 to further improve the sealing performance of the display panel.

In the embodiment, a gap is provided between the sealing layer 601 and the display layer 70, and the gap is filled with a flow blocking medium 602. The flow blocking medium 602 can further prevent the outside air from contacting with each film layer of the display layer 70, and further improve the sealing performance of the display panel. In addition, the flow blocking medium 602 has a certain degree of fluidity, and a corresponding shape of the flow blocking medium 602 can be adjusted along with the movement and deformation of the substrate 60, the cover plate 20 and the display layer 70, where the gap surrounds an outside of the display layer 70.

The flow blocking medium 602 can be of a deformable non-solid form such as a fluid state, a semi-fluid state, or a gel, and has certain fluidity, therefore, when the display panel is bent, the flow barrier medium 602 filled between the sealing layer 601 and the display layer 70 will deform correspondingly with the bending of the substrate 60 and the cover plate 20, so that it is always consistent with the shape of the gap between the sealing layer and the display layer 70. In this way, the flow blocking medium 602 can always seal an area of the outside of the edge of the display layer 70 to prevent the display layer 70 from contacting with the outside air.

Preferably, the flow blocking medium 602 includes insulating oil. The insulating oil is not conductive, which can prevent the display layer 70 from electric leakage outward. The flow blocking medium 602 in the embodiment may also include lubricating oil and the like.

Preferably, the sealing layer 601 includes a closed-cell foam layer 6014. The closed-cell foam used has a closed-cell ratio of 100%, has good elasticity, and is not easy to break after being bent. When the gap between the sealing layer 601 and each film layer is filled with the flow blocking medium 602, the closed-cell foam layer 6014 can prevent the flow blocking medium 602 from penetrating into the sealing layer 601, so as to prevent the flow blocking medium 602 in the gap from being reduced in volume, in addition, the outside air can also be prevented from entering the sealing layer 601.

In the embodiment, the sealing layer 601 can also be made of a silicone member or a thermoplastic polyurethane (TPU) member to improve the moisture resistance, water resistance, radiation resistance, and weather resistance of the sealing layer 601, thereby improving the overall performance of the display panel.

In the embodiment, the display layer 70 is configured to display images. Specifically, the display layer 70 may include an array substrate formed on the substrate 60, and a pixel defining layer formed on the array substrate, and is encapsulated by an encapsulation layer, where the encapsulation layer is connected to the touch layer through a connecting glue. The flow blocking medium 602 is in a gap between the auxiliary transparent layer 40 and the sealing layer. A thin film transistor is provided in the array substrate, and a light emitting unit in the pixel defining layer can be controlled to emit light through the thin film transistor. The substrate 60 is configured to carry the array substrate, and during production, the substrate 60 can be formed first, and then film layers such as the array substrate, the pixel defining layer, and the touch layer 30 are sequentially formed on the substrate 60.

Referring to FIG. 2, an encapsulation dam 701 is provided outside the display layer 70, and the encapsulation layer 80 extends to an outside of the display panel and covers onto the encapsulation dam to encapsulate the display layer 70. The touch layer 30 is disposed on a side of the encapsulation layer 80 facing the cover plate 20, and the touch layer 30 is connected to the encapsulation layer 80 by, for example, a connecting adhesive 301, where the connecting adhesive 301 may be an optical adhesive. The polarizer 50 is disposed between the touch layer 30 and the cover 20, and the polarizer 50 can also be connected to the touch layer 30 through the optical adhesive. The auxiliary transparent layer 40 may be an optical adhesive layer, and the optical adhesive layer is disposed between the cover plate 20 and the polarizer 50 to realize the connection between the cover plate 20 and the polarizer 50. An edge of the optical adhesive layer extends toward the substrate 60 to form a sealed side, and the sealed side can wrap film layers between the substrate 60 and the optical adhesive layer to further improve the sealing performance of the display panel. The flow blocking medium 602 is filled in a gap between the sealed sides and the sealing layer 601.

In the embodiment, the sealing layer 601 includes a plurality of sealing sublayers stacked along the direction of light emitting, for example, includes three sealing sublayers 6011, 6012, and 6013. When the display panel is bent, relative sliding may occur between adjacent sealing sublayers to avoid the damage of each film layer due to the occurrence of stress concentration thereto when the display panel is bent. In addition, relative sliding may occur between the adjacent sealing sublayers, which prevents the entire sealing layer 601 from sliding between the cover plate 20 and the substrate 60, and improves the stability of the sealing layer 601.

The sealing layer 601 can be connected to the cover plate 20 and the substrate 60 by an adhesive, respectively, and the adhesive may be an optical adhesive. Adjacent sealing sublayers can be connected by pressing to ensure the seal between the adjacent sealing sublayers.

Exemplarily, the number of sealing sublayers may be two, the sealing sublayer close to the substrate 60 is provided in the same layer as the display layer 70, and the sealing sublayer close to the cover plate 20 is provided in the same layer as the polarizer 50 and/or the touch layer 30, therefore, when the display panel is bent, the sealing sublayer close to the substrate 60 moves synchronously with the display layer 70, and the sealing sublayer close to the cover plate 20 moves synchronously with its corresponding film layer. Certainly, the number of sealing sublayers can also be three, accordingly, the sealing sublayer close to the substrate 60 is provided in the same layer as the display layer 70, one of the other two sealing sublayers is provided in the same layer as the touch layer 30, and the other is provided in the same layer as the polarizer 50, and when the display panel is bent, the three sealing sublayers move synchronously with their corresponding film layers. In the embodiment, the number of sealing sublayers can also be four, five, etc.

In other embodiments, a display device including the display panel described above is also provided.

The display device may be a product or a component with a display function such as a mobile phone, a tablet computer, a television, a monitor, an e-book, an e-paper, a smart watch, a notebook computer, a digital photo frame, or a navigator.

In the display device provided by the embodiment, the occurrence of cracks between the first sealant 101 and the touch layer 30 as well as the flexible circuit board 10, caused by the stress of the first sealant 101, can be avoided by disposing the auxiliary transparent layer 40 between the touch layer 30 and the cover plate 20, and disposing the auxiliary transparent layer 40 close to the cover plate 20, making the distance between the surface of the auxiliary transparent layer 40 facing the cover plate 20 and the cover plate 20 not greater than the distance between the surface of the first sealant 101 facing the cover plate 20 and the cover plate 20, and making the cover plate 20 first contacts with the auxiliary transparent layer 40 when the cover plate 20 is installed.

Finally, it should be noted that the foregoing embodiments are merely intended for describing the technical solutions of the present disclosure other than limiting the present disclosure. Although the present disclosure is described in detail with reference to the foregoing embodiments, persons of ordinary skill in the art should understand that they may still make modifications to the technical solutions described in the foregoing embodiments or make equivalent substitutions to some or all technical features thereof. And these modifications or substitutions do not make the essence of the corresponding technical solutions depart from the scope of the technical solutions of embodiments of the present disclosure.

What is claimed is:

1. A display panel, comprising:
    a flexible circuit board, a touch layer, a cover plate, and an auxiliary transparent layer disposed between the cover plate and the touch layer and close to the cover plate;
    wherein the flexible circuit board is connected to the touch layer, a first sealant is provided at a boundary position between the touch layer and the flexible circuit board, and the first sealant is located on sides of the flexible circuit board and the touch layer facing the cover plate; a distance between a surface of the auxiliary transparent layer facing the cover plate and the cover plate is less than or equal to a distance between a surface of the first sealant facing the cover plate and the cover plate,
    wherein the display panel further comprises a sealing layer, a substrate and a display layer; the substrate and the display layer are stacked in sequence along a direction of light emitting; the sealing layer is located between the cover plate and the substrate and is disposed around an outer edge of the display layer, and
    wherein the sealing layer comprises a plurality of sealing sublayers stacked along the direction of light emitting, and adjacent sealing sublayers are slidable relatively.

2. The display panel according to claim 1, wherein the boundary position comprises a boundary line between the touch layer and an input end of the flexible circuit board, a surface of the touch layer, covered by the first sealant and close to the cover plate, at one side of the boundary line, and a surface of the flexible circuit board, covered by the first sealant and close to the cover plate, at the other side of the boundary line.

3. The display panel according to claim 1, further comprising a second sealant, wherein the second sealant is disposed on a side of the flexible circuit board away from the cover plate, the second sealant is located at a boundary position between the touch layer and the flexible circuit board, and seals a boundary line between a surface of the flexible circuit board away from the cover plate and the touch layer.

4. The display panel according to claim 3, wherein the first sealant and the second sealant are selected from any one or more of polyacrylate, epoxy acrylate, and linear unsaturated polyester.

5. The display panel according to claim 3, wherein the auxiliary transparent layer comprises an optical adhesive layer.

6. The display panel according to claim 5, wherein the first sealant and the second sealant have an elastic modulus greater than an elastic modulus of the optical adhesive layer.

7. The display panel according to claim 1, wherein the display panel further comprises a polarizer, and the polarizer is disposed between the touch layer and the auxiliary transparent layer or on a side of the touch layer away from the cover plate.

8. The display panel according to claim 1, wherein an installation step is provided on a surface of the touch layer close to an input end of the flexible circuit board.

9. The display panel according to claim 1, wherein the cover plate comprises a hard layer and an organic layer stacked on the hard layer, and the hard layer is disposed away from the touch layer.

10. The display panel according to claim 9, wherein the hard layer is an ultra-thin glass layer, and the organic layer is a polyimide layer or a thermoplastic polyurethane elastomer layer.

11. The display panel according to claim 1, wherein the sealing layer is formed on the substrate and extends upward from the substrate to contact with the cover plate.

12. The display panel according to claim 1, wherein an edge of the auxiliary transparent layer extends toward the substrate to form a sealed side, and the sealed side wraps film layers disposed between the substrate and the auxiliary transparent layer.

13. The display panel according to claim 12, wherein a gap is provided between the sealing layer and the auxiliary transparent layer, and the gap is filled with an air flow blocking medium.

14. The display panel according to claim 13, wherein the display layer comprises an array substrate formed on the substrate, and a pixel defining layer formed on the array substrate, and is encapsulated by an encapsulation layer which is connected with the touch layer.

15. The display panel according to claim 14, wherein the air flow blocking medium comprises insulating oil, and the sealing layer comprises a closed-cell foam layer.

16. A display device comprising the display panel according to claim 1.

\* \* \* \* \*